US012787767B2

(12) United States Patent
Schoneboom et al.

(10) Patent No.: US 12,787,767 B2
(45) Date of Patent: Nov. 3, 2026

(54) EMITTERS FOR INTEGRATED POWER CARD COOLING

(71) Applicants: Denso International America, Inc., Southfield, MI (US); Denso Corporation, Kariya (JP)

(72) Inventors: Sean Schoneboom, Owosso, MI (US); Jason Spenny, Berkley, MI (US); Siddharth Dasgupta, Windsor (CA); John Vandermeer, Royal Oak, MI (US)

(73) Assignees: DENSO International America Inc., Southfield, MI (US); DENSO Corporation, Kariya-city (JP)

(*) Notice: Subject to any disclaimer, the term of this patent is extended or adjusted under 35 U.S.C. 154(b) by 217 days.

(21) Appl. No.: 18/616,659

(22) Filed: Mar. 26, 2024

(65) Prior Publication Data

US 2024/0395657 A1 Nov. 28, 2024

Related U.S. Application Data

(60) Provisional application No. 63/504,532, filed on May 26, 2023.

(51) Int. Cl.
*H01L 23/367* (2006.01)
*H01L 23/31* (2006.01)
(Continued)

(52) U.S. Cl.
CPC ....... *H10W 40/228* (2026.01); *H10W 40/226* (2026.01); *H10W 40/43* (2026.01);
(Continued)

(58) Field of Classification Search
CPC ... H02M 1/008; H05K 7/209; H05K 7/20927; H05K 2201/066; H05K 7/20872;
(Continued)

(56) References Cited

U.S. PATENT DOCUMENTS 5,705,850 A * 1/1998 Ashiwake ........... H10W 40/774 257/722
5,796,160 A * 8/1998 Kozono ............. H10W 40/778 257/796
(Continued)

FOREIGN PATENT DOCUMENTS

JP 2008198928 A 8/2008
TW I239606 B 9/2005

OTHER PUBLICATIONS

Tada et al, Semiconductor Device, Dec. 17, 2020, PE2E English NPL, WO-2020250425-A1 (Year: 2020).*
(Continued)

*Primary Examiner* — Michael A Matey
(74) *Attorney, Agent, or Firm* — Christopher G. Darrow; Darrow Mustafa PC

(57) ABSTRACT

A power card assembly includes an integrated circuit and an emitter in thermal communication with the integrated circuit. The emitter includes a base portion and a plurality of spaced-apart projections extending from the base portion. In some arrangements, the power card assembly may include multiple integrated circuits, and multiple associated emitters may be employed to increase heat dissipation. The power card assembly structures described operate to minimize the number of thermal interfaces in the power card assembly and facilitate dissipation of heat from the power card assembly.

17 Claims, 7 Drawing Sheets

(51) Int. Cl.

| | |
|---|---|
| ***H01L 23/467*** | (2006.01) |
| ***H01L 23/473*** | (2006.01) |
| ***H01L 25/07*** | (2006.01) |
| ***H10W 40/22*** | (2026.01) |
| ***H10W 40/43*** | (2026.01) |
| ***H10W 40/47*** | (2026.01) |
| ***H10W 74/10*** | (2026.01) |
| ***H10W 90/00*** | (2026.01) |
| *H05K 1/02* | (2006.01) |
| *H05K 7/20* | (2006.01) |

(52) U.S. Cl.
CPC .......... *H10W 40/47* (2026.01); *H10W 74/114* (2026.01); *H10W 90/00* (2026.01); *H05K 1/0203* (2013.01); *H05K 7/209* (2013.01); *H05K 2201/066* (2013.01)

(58) Field of Classification Search
CPC ...... H05K 1/0203; H05K 1/0209; H05K 1/11; H05K 1/181; H05K 3/284; H05K 2203/1316; H05K 2203/1327; H05K 5/0247; H05K 7/20509; H05K 1/021; H05K 1/0212; H05K 1/111; H05K 1/145; H05K 1/182; H05K 2201/10545; H05K 5/0217; H05K 5/04; H05K 5/065; H05K 5/10; H05K 7/14; H05K 7/1427; H05K 7/20; H05K 7/20254; H05K 7/20272; H05K 7/20463; H05K 7/20409; H05K 7/20854; H10W 40/778; H10W 90/734; H10W 74/016; H10W 40/228; H10W 40/47; H10W 74/114; H10W 40/43; H10W 90/00; H10W 40/226; H01F 27/29; H01R 43/24
See application file for complete search history.

(56) References Cited

U.S. PATENT DOCUMENTS

| | | | | |
|---|---|---|---|---|
| 6,093,961 | A | 7/2000 | McCullough | |
| 6,274,924 | B1 | 8/2001 | Carey et al. | |
| 8,772,927 | B2 * | 7/2014 | Bezama | H10W 40/47 257/706 |
| 8,966,747 | B2 * | 3/2015 | Vinciarelli | H05K 1/111 29/830 |
| 9,013,877 | B2 * | 4/2015 | Harubeppu | H10W 40/00 174/15.1 |
| 9,173,329 | B2 * | 10/2015 | Joo | H05K 7/20927 |
| 9,362,219 | B2 * | 6/2016 | Kawase | H10W 70/658 |
| 9,521,737 | B2 * | 12/2016 | Izuo | H05K 1/0203 |
| 10,660,236 | B2 | 5/2020 | Rush et al. | |
| 2007/0194419 | A1 * | 8/2007 | Ozawa | H10W 72/00 257/E23.079 |
| 2007/0256810 | A1 * | 11/2007 | Di Stefano | H10W 40/47 257/E23.098 |
| 2008/0237847 | A1 * | 10/2008 | Nakanishi | H10W 40/47 257/722 |
| 2009/0145581 | A1 * | 6/2009 | Hoffman | F28F 1/42 165/80.3 |
| 2011/0304039 | A1 * | 12/2011 | Miyamoto | H10W 40/778 257/E23.08 |
| 2012/0181679 | A1 * | 7/2012 | Kadoguchi | H10W 40/778 257/E23.116 |
| 2015/0097281 | A1 * | 4/2015 | Adachi | H10W 40/47 257/714 |
| 2017/0110341 | A1 * | 4/2017 | Onoda | H10W 40/037 |
| 2019/0118735 | A1 * | 4/2019 | Ota | B60R 16/02 |
| 2019/0335628 | A1 * | 10/2019 | Lei | H05K 7/20927 |
| 2020/0187385 | A1 * | 6/2020 | Olesen | H05K 7/20254 |
| 2023/0284414 | A1 * | 9/2023 | Kang | F28F 3/12 165/80.4 |
| 2023/0300972 | A1 * | 9/2023 | Zhou | H05K 3/4697 174/260 |
| 2023/0317559 | A1 * | 10/2023 | Wang | H10W 40/47 257/715 |
| 2024/0014096 | A1 * | 1/2024 | Pavlicek | H10W 40/228 |
| 2024/0120255 | A1 * | 4/2024 | Truessel | H05K 7/20927 |
| 2025/0105110 | A1 * | 3/2025 | Tsuyuno | H10W 70/458 |

OTHER PUBLICATIONS

Rathore et al. "Flow Characterization in Triply-Periodic-Minimal-Surface (TPMS) based Porous Geometries: Part 1—Hydrodynamics", Transport in Porous Media. vol. 146, p. 669-701. 2023.

* cited by examiner

EMITTERS FOR INTEGRATED POWER CARD COOLING

CROSS REFERENCE TO RELATED APPLICATIONS

This application claims benefit of U.S. Provisional Application No. 63/504,532, filed on May 26, 2023, which is herein incorporated by reference in its entirety.

FIELD

The present disclosure relates to dissipation of heat generated by integrated circuits and, more particularly, to dissipation of heat generated by integrated circuits incorporated into a power card assembly.

BACKGROUND

A power card assembly incorporating integrated circuits (IC's) may be utilized in various devices as a power inverter circuit for changing direct current (DC) to alternating current (AC). Integrated circuits may generate copious quantities of heat during operation. This heat must be transferred away from the integrated circuits and dissipated to prevent loss of function and/or damage to the integrated circuits and other elements of the power card assembly.

SUMMARY

In one aspect of the embodiments described herein, a power card assembly includes an integrated circuit, an emitter in thermal communication with the integrated circuit, and an overmold covering at least a portion of each of the integrated circuit and the emitter. The overmold may be structured to secure the emitter in position with respect to the integrated circuit. The emitter includes at least one cavity structured to receive therein at least a portion of a gasket structured to form a fluid-tight seal between the overmold and the gasket when the gasket is pressurized against the overmold. The emitter may include a base portion and a coolant fluid-receiving cavity array in thermal communication with the base portion. In some arrangements the coolant fluid-receiving cavity array includes a plurality of spaced-apart projections extending from the base portion. In some arrangements, the projections have elliptical cross-sectional shapes. In some arrangements, the end portions of adjacent projections of a row of projections are structured to intersect so as to form a continuous wall extending along the row at the projection end portions, and wherein coolant fluid flow passages are formed between the wall, non-enlarged parts of the projections, and the base portion. In some arrangements, the coolant fluid-receiving cavity array comprises a porous Triply-Periodic-Minimal-Surface lattice structure.

In some arrangements, the emitter further includes a cover attached to the base portion, the cover and the base portion combining to define an enclosure into which the coolant fluid-receiving cavity array extends. The cover may include at least one wall structured to define a cavity. At least one passage may extend through the at least one wall and may be structured to enable fluid communication between the cavity and an exterior of the cavity. In some arrangements, the cover includes a pair of passages extending through the at least one wall, with each passage being structured to enable fluid communication between the cavity and the exterior of the cavity. In some arrangements, the cover, the base portion, and the coolant fluid-receiving cavity array are formed integrally as a single piece (using a suitable additive manufacturing process, for example).

In another aspect of the embodiments described herein, a power card assembly includes an integrated circuit and an emitter in thermal communication with the integrated circuit. The emitter includes a base portion and a coolant fluid-receiving cavity array thermally-coupled to the base portion. In some arrangements, the coolant fluid-receiving cavity array includes a plurality of spaced-apart projections extending from the base portion. In some arrangements, the emitter further includes a cover attached to the base portion, the cover and the base portion combining to define an enclosure into which the coolant fluid-receiving cavity array extends. The cover may include at least one wall structured to define a cavity. The cover may also include at least one passage extending through the at least one wall and structured to enable fluid communication between the cavity and an exterior of the cavity. In some arrangements, the power card assembly may also include an overmold covering at least a portion of the emitter and the integrated circuit, the overmold being structured to secure the emitter in position with respect to the integrated circuit. The overmold may also include at least one cavity structured to receive therein at least a portion of a gasket structured to form a fluid-tight seal between the overmold and the gasket when the gasket is pressurized against the overmold.

In yet another aspect of the embodiments described herein, a method of cooling an integrated circuit is provided. The method may include a step of securing an emitter in thermal communication with the integrated circuit, the emitter including a coolant fluid-receiving cavity array positioned inside the enclosure, the emitter defining an enclosure structured to receive heat communicated from the integrated circuit, the emitter including a coolant fluid-receiving cavity array positioned inside the enclosure, a first passage structured to enable fluid communication into the enclosure, and a second passage structured to enable fluid communication out of the enclosure.

The method may also include a step of generating a flow of coolant fluid into the enclosure through the first passage, through at least a portion of the coolant fluid-receiving cavity array to the second passage, and out of the enclosure through the second passage, to extract heat from the emitter. In one or more arrangements, the enclosure includes a cover and a base portion, and the cover, the base portion, and the coolant fluid-receiving cavity array are formed integrally as a single piece.

BRIEF DESCRIPTION OF THE DRAWINGS

The accompanying drawings, which are incorporated in and constitute a part of the specification, illustrate various assemblies, systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

The power card assembly structures described herein minimize the number of thermal interfaces in the power card assembly while facilitating rapid heat transfer from the integrated circuits to one or more heat dissipation element(s) or "emitters" configured to promote dissipation of the heat to a coolant fluid exterior of the power card assembly. These features aid in minimizing the cost and of the power card assembly and maximizing the operational efficiency of the power card assembly.

Figure 1A:
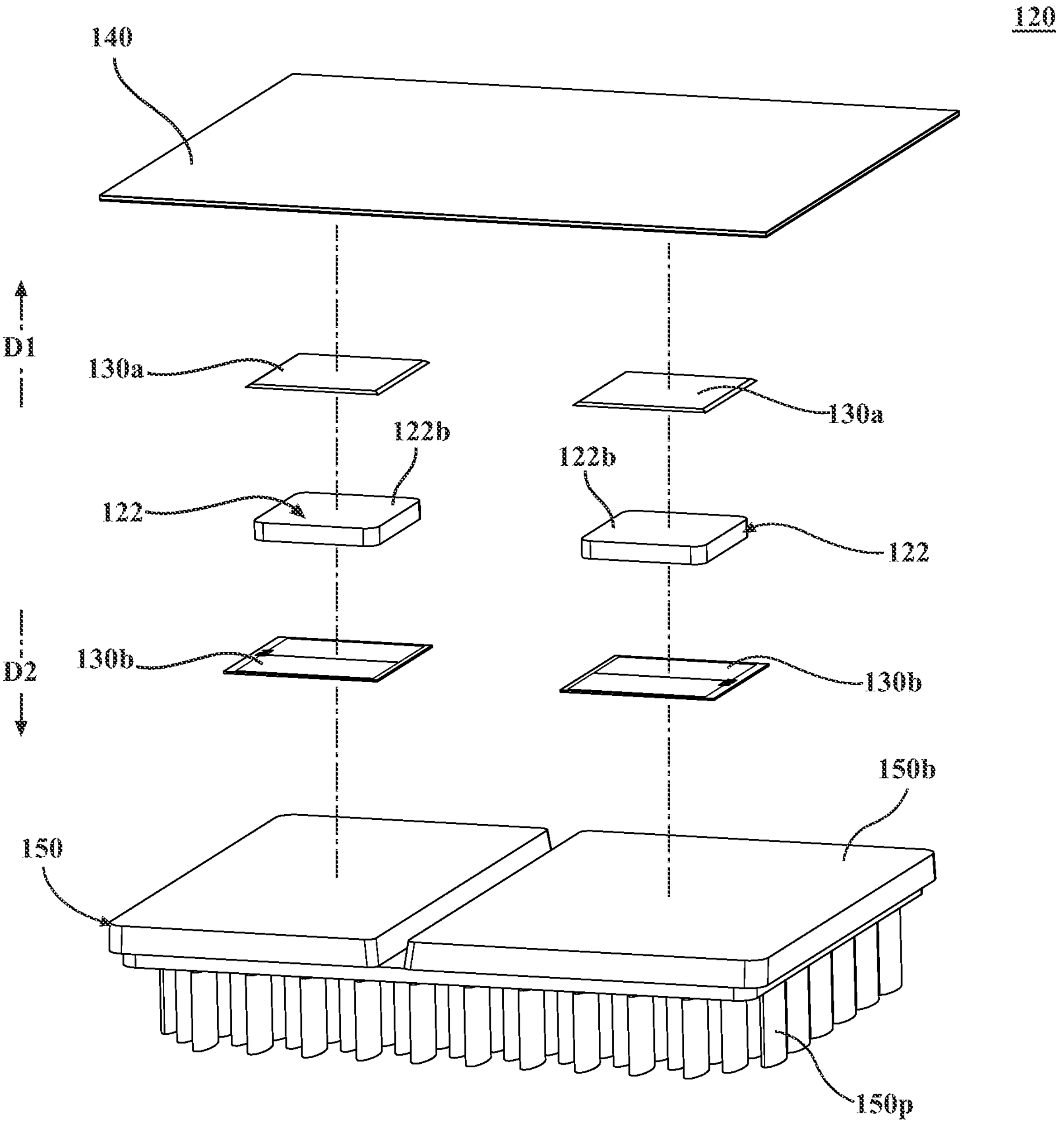
FIG. 1A is an exploded view of a power card assembly in accordance with an embodiment described herein, incorporating an embodiment of a first emitter and a first embodiment of a second emitter.
Figure 1B:
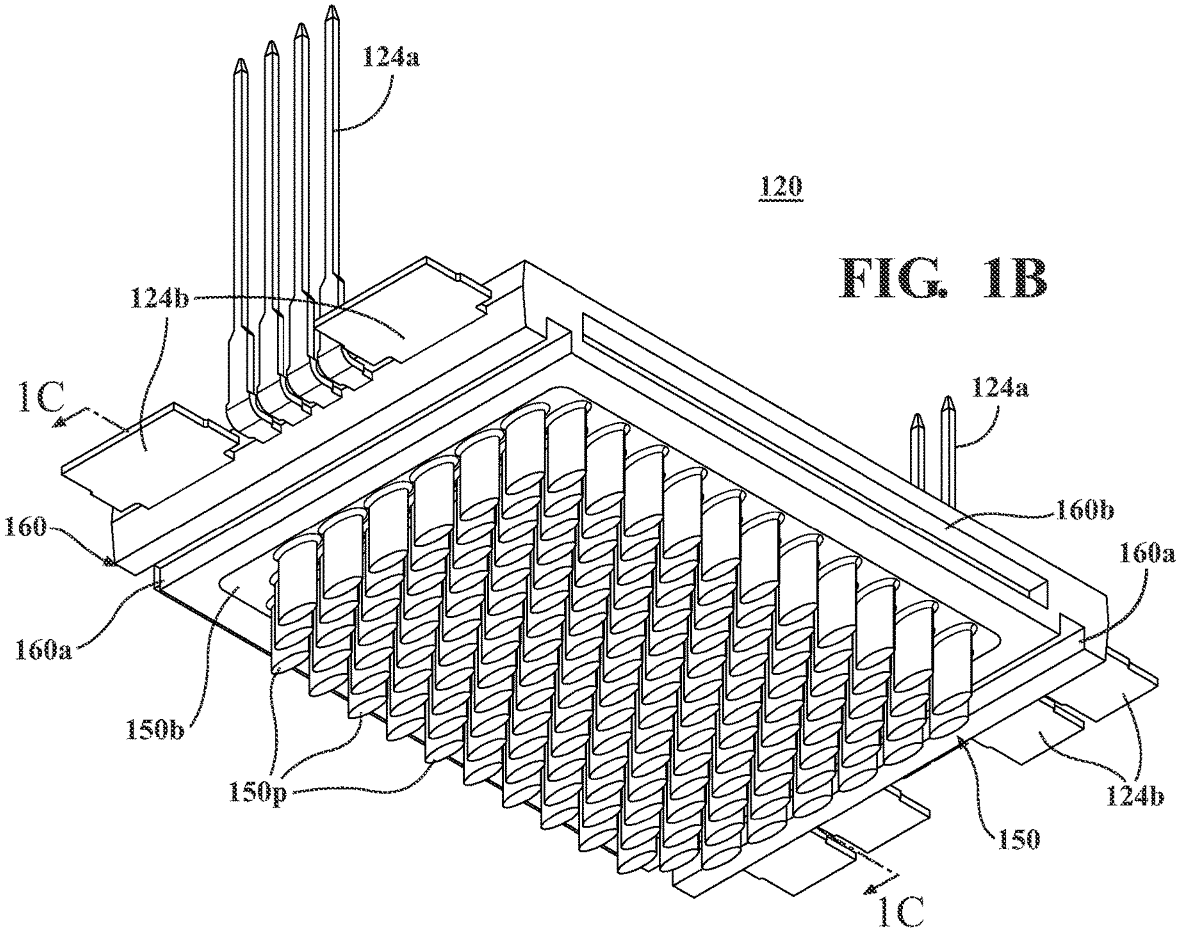
FIG. 1B is a schematic perspective view of the power card assembly of FIG. 1A, shown in an assembled condition.
Figure 1C:
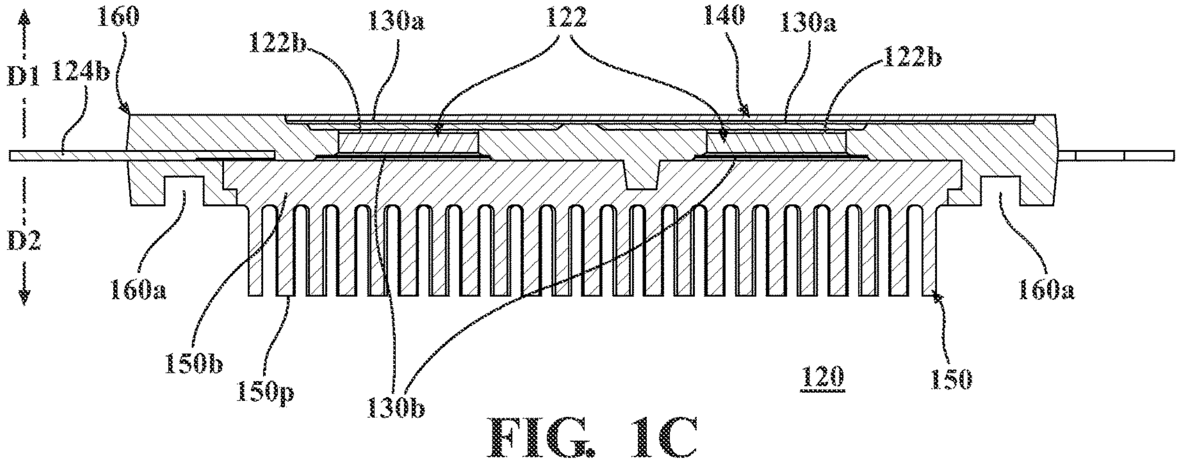
FIG. 1C is a schematic side cross-sectional view of the power card assembly of FIG. 1A.

FIG. 1A is an exploded view of a power card assembly 120 in accordance with an embodiment described herein. FIG. 1B is a schematic perspective view of the power card assembly 120 of FIG. 1A, shown in an assembled condition. FIG. 1C is a schematic side cross-sectional view of the power card assembly 120 of FIG. 1A. For purposes described herein, a "power card assembly" is an assembly of associated elements configured to operate in concert as a power inverter circuit for changing direct current (DC) to alternating current (AC). In particular arrangements, the power inverter circuit is structured to provide alternating current for operation of an electric traction motor in an electric vehicle (EV).

Referring to FIG. 1A, the power card assembly 120 may incorporate one or more integrated circuits (IC's) 122 configured to operate as switching transistors for changing direct current to alternating current. The embodiments shown in the drawings include two IC's 122 incorporated into the power card assembly 120. Additional elements of the power card assembly 120 as described herein may be generally directed to connecting the IC's 122 to components external to the power card assembly 120 and/or to transferring heat produced by operation of the IC's 122 away from the IC's.

For example, referring to FIGS. 1A-1C, each IC 122 may include terminals (generally designated 124) extending integrally from (or electrically connected to) an associated body 122*b* of an IC 122 containing the transistors and other circuit elements. In one or more arrangements, for example, certain ones 124*a* of the terminals 124 may extend away from the power card assembly 120 to enable electrical connection to a controller (not shown) configured for controlling operations of the power card assembly. Other terminals 124*b* may extend away from the power card assembly 120 to enable electrical connection between the IC 122 and conductive traces of a circuit board or other electronic device (not shown) using soldering, resistance welding, or another suitable other method of establishing and maintaining electrical contact. Terminals may also be formed with (or electrically connected to) the integrated circuits for other purposes.

Referring to FIGS. 1A and 1C, proceeding in a direction D1 from the IC's 122, one or more thermally-conductive spacer(s) 130*a* may be interposed between each of the IC's 122 and an associated first emitter 140 (described in greater detail below). The spacer(s) 130*a* may be structured to conform to (and adhere to) rough or uneven exterior surfaces of the IC body 122*b* and first emitter 140 to enhance thermal communication between these components, thereby facilitating more efficient heat transfer from the IC's 122 to the first emitter 140. As used herein, "thermal communication" refers to any direct, physical contact and/or indirect contact between elements enabling heat transfer between the elements.

The thermally-conductive spacer(s) 130*a*, 130*b* described herein may be formed from any suitable material or materials, including metallic materials such as pure copper, a copper alloy, pure aluminum, an aluminum alloy, a thermally-conductive polymer, or any other structurally and thermally suitable material. In some arrangements, a thermally-conductive spacer 130*a* may be attached to the IC body 122*b* by a layer of solder (not shown) interposed between the spacer 130*a* and an exterior surface of the IC body 122*b*.

Embodiments of the power card assembly described herein may include one or more heat dissipation element(s) or "emitters". The terms "heat-dissipation element" and "emitter" may be used interchangeably herein and refer to an element structured to transfer heat generated by the IC's 122 to a coolant fluid, for example, by free convection, forced convection, and/or conduction. The coolant fluid may be a gas, such as air residing in an environment exterior of the cooling card assembly, for example. The coolant fluid may be a liquid, such as water or an oil, for example. The coolant fluid may be static. Alternatively, the coolant fluid may be pressurized to produce a movement or flow of the fluid along surfaces of the emitter to more rapidly extract heat from the emitter.

Embodiments of the emitters described herein may be structured to facilitate rapid and even distribution of received heat throughout the structure of the emitter, to facilitate rapid dissipation of the received heat. Each emitter embodiment described herein may be formed from any suitable material or materials, including metallic materials such as pure copper, a copper alloy, pure aluminum, an aluminum alloy, a thermally conductive polymer, or any other material(s) which are suitably thermally-conductive, compatible with the desired emitter fabrication process(es), and satisfy the heat dissipation requirements of a particular application.

In one or more arrangements, a single emitter may be structured to be in thermal communication with a single associated IC, so as to receive and dissipate heat from the single IC. Referring to FIGS. 1A-1C, in other arrangements, a single emitter (such as first emitter 140, for example) may be structured to be in thermal communication with multiple associated IC's 122 so as to receive and dissipate heat from the multiple IC's.

Referring to FIGS. 1A-1C, in one or more arrangements, the power card assembly 120 may include a first emitter 140 positioned in thermal communication with associated IC's 122 via associated thermally-conductive spacers 130*a*. In particular arrangements, the first emitter 140 may be structured as a flat plate secured in physical contact with the thermally-conductive spacers 130*a* and in thermal communication with each IC 122 through an associated spacer 130*a*. In some arrangements, the first emitter 140 may be attached to the thermally-conductive spacers 130*a* by associated layers of solder (not shown) interposed between the first emitter 140 and the spacers 130*a*.

Referring again to FIGS. 1A-1C, proceeding in a direction D2 from the IC's 122, one or more thermally-conductive spacer(s) 130*b* (similar to spacers 130*a* previously described) may be interposed between each of the IC's 122 and an associated second emitter 150.

The power card assembly 120 may also incorporate the second emitter positioned in thermal communication with one or more associated IC's 122 via the thermally-conductive spacers 130*b*.

In one or more arrangements, the second emitter may include a base portion and a coolant fluid-receiving cavity array in thermal communication with the base portion. The coolant fluid-receiving cavity array is a structure defining cavities in the form of pockets and/or flow-through passages configured for receiving coolant fluid therein. The cavity array is structured to enable and facilitate heat transfer between the structures (including the base portion) defining the cavities and the coolant fluid residing in (and flowing through) the cavities. In one or more arrangements, the cavity array may be formed integrally (i.e., as a single piece) with the base portion and may extend from a side of the base portion. Coolant fluid may flow into, through and/or out of the cavity array. The cavity array defines openings enabling coolant fluid to flow into and/or out of the array.

In one or more arrangements, at any given time, depending on the structure of the cavity array, the structure and composition of the coolant fluid, the pressure differentials across different portions of the cavity array, and other pertinent factors, portions of the coolant fluid present in the cavity array may be static. For example, in some arrangements, static masses of coolant fluid may reside inside one or more of the pockets and/or passages for a relatively greater length of time. Alternatively (or simultaneously), quantities of coolant fluid may flow into the array, through portions of the array, and/or out of the array.

Embodiments of the cavity array described herein may be structured to optimize any of overall fluid flow rate, turbulence, surface area available for heat transfer, and/or other pertinent heat transfer parameters to achieve a desired or acceptable heat transfer rate for a given application. Details of the cavity array structure to be used for a particular application may be determined using methods currently known or later developed. For example, suitable cavity array structures may be determined analytically (e.g., through computer modeling) and/or experimentally (e.g., through testing of physical samples).

Referring to FIGS. 1A-1C, in one or more particular arrangements, the second emitter 150 may include a base portion 150*b* and a cavity array formed by a plurality of adjacent spaced-apart projections 150*p* extending from the base portion 150*b*. The embodiment shown includes an arrangement of parallel rows of projections 150*p*. Cavities in the form of fluid flow passages are defined by the projections 150*p* and formed between the projections. In general, the geometries of the base portion 150*b* and projections 150*p* and the spatial arrangement of the projections may be configured to maximize the surface area of the emitter in contact with a coolant fluid and/or to facilitate a flow of coolant fluid between the projections 150*p*. These conditions may help to maximize heat transfer from the base portion 150*b* and projections 150*p* to the coolant fluid.

Referring to FIG. 1C, in particular arrangements, the projections 150*p* may all extend from the base portion 150*b* in a first general direction D2 away from the IC's 122. In particular arrangements, the projections 150*p* may extend parallel with each other. In particular arrangements, the projections 150*p* may extend perpendicular (within applicable tolerance limits) to an exterior surface of the base portion 150*b*.

In particular arrangements, the projections 150*p* may be in the form of fins having generally rectangular cross-sectional shapes. In particular arrangements, the projections 150*p* may be in the form of pins having generally cylindrical cross-sectional shapes. Referring to FIG. 1B, in particular arrangements, the projections 150*p* may be in the form of pins having generally elliptical cross-sectional shapes. Other cross-sectional shapes of the projections 150*p* are also possible. In particular arrangements, the projections 150*p* may extend from the base portion 150*b* in parallel rows. Referring to FIG. 1B, in other particular arrangements, the projections 150*p* in one row may be offset with respect to other projections 150*p* in adjacent rows.

Particular dimensions of the projections 150*p* and their spatial arrangement along the base portion 150*b* may depend on factors such as whether the coolant fluid is a gas or a liquid, whether the coolant fluid in contact with the projections 150*p* is static or moving/flowing, the heat dissipation requirements of the emitter 150, and other pertinent factors.

The second emitter 150 may be formed using any suitable process, such as casting, molding, or an additive manufacturing (AM) process, such as a suitable 3D-printing process, for example. Referring to FIG. 1C, in one example, a suitable 3D-printing process may be used to deposit successive layers of material proceeding in direction D2 to progressively form the base portion 150*b* and the projections 150*p*.

Figure 2:
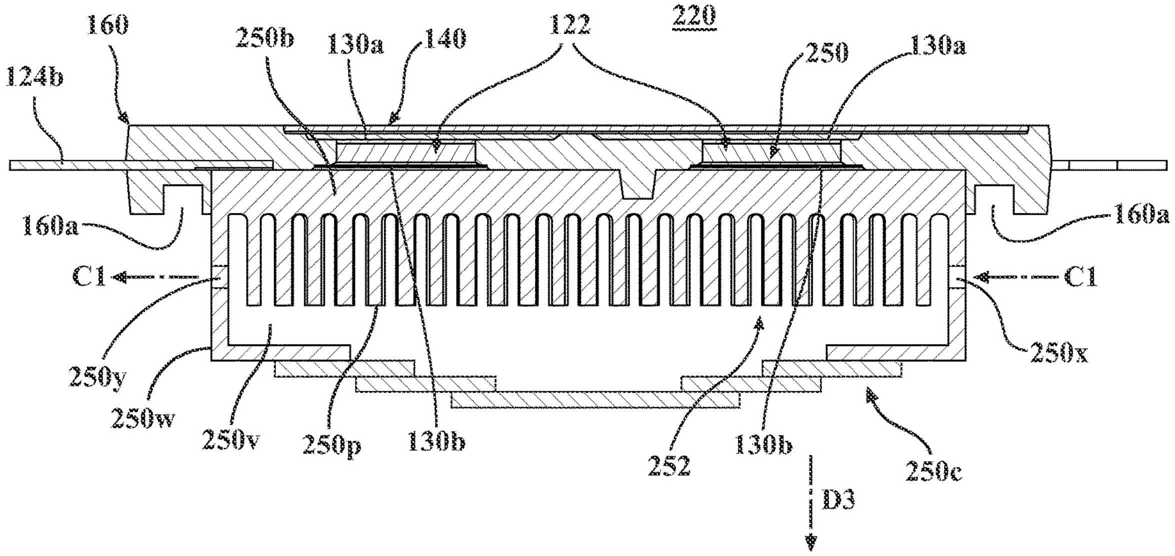
FIG. 2 is a schematic side cross-sectional view of a power card assembly in accordance with another embodiment described herein, incorporating a second embodiment of the second emitter.

FIG. 2 is a schematic side cross-sectional view of a power card assembly 220 in accordance with another embodiment described herein. The power card assembly 220 of FIG. 2 incorporates another embodiment 250 of the second emitter. Referring to FIG. 2, in this alternative arrangement 250, the second emitter may include a base portion 250*b* and a plurality of projections 250*p* extending from the base portion 250*b* as previously described with regard to emitter 150. The emitter 250 may also include a cover 250*c* attachable to the base portion 250*b*, with the cover 250*c* and the base portion 250*b* combining to define an enclosure 252 into which the projections 250*p* extend when the cover 250*c* is attached to the base portion 250*b*. The cover 250*c* may enable confinement of a liquid coolant fluid in intimate thermal contact with the base portion 250*b* and the projections 250*p*. As described herein, the cover 250*c* may also enable a controlled or directed flow of a gas or liquid coolant fluid C1 over exposed surfaces of the base portion 250*b* and projections 250*p*.

In one or more arrangements, the cover 250*c* may include at least one wall 250*w* structured to define a cavity 250*v*. The at least one wall 250*w* may include at least one passage 250*x* extending therethrough. The at least one passage 250*x* may be structured to enable fluid communication between the cavity 250*v* and an exterior of the cavity. The passage 250*x* may be used to introduce a coolant fluid C1 into the enclosure 252 and/or to extract coolant fluid from the enclosure (e.g., for replacement of the coolant fluid, for example).

In some arrangements, the cover 250*c* includes a pair of passages 250*x*, 250*y* extending through the at least one wall 250*w*, with each passage being structured to enable fluid communication between the cavity 250*v* and the exterior of the cavity. The pair of passages 250*x*, 250*y* may be spatially arranged so as to facilitate a flow of coolant fluid C1 into a first passage 250*x* and through the enclosure 252 along the projections 250*p* and base portion 250*b* to extract heat from the projections 250*p* and base portion 250*b*. The coolant fluid C1 may then flow to the second passage 250*y* and out of the enclosure 252 through the second passage. In this manner, heat may be extracted from the enclosure 252.

In one or more arrangements, the cover 250*c* may be formed separately from the base portion 250*b* and projections and then attached to the base portion using any suitable attachment method. The separate cover may be formed using any suitable method, for example, by casting, molding, or a suitable additive manufacturing process.

In other arrangements, as shown in FIG. 2, the cover 250*c*, the base portion 250*b*, and the projections 250*p* may be formed integrally as a single piece, using an additive manufacturing process, for example. Referring to FIG. 2, in one example, a suitable 3D-printing process may be used to deposit successive layers of material proceeding in direction D3 to progressively form the base portion 250*b* and the projections 250*p*.

Figure 3A:
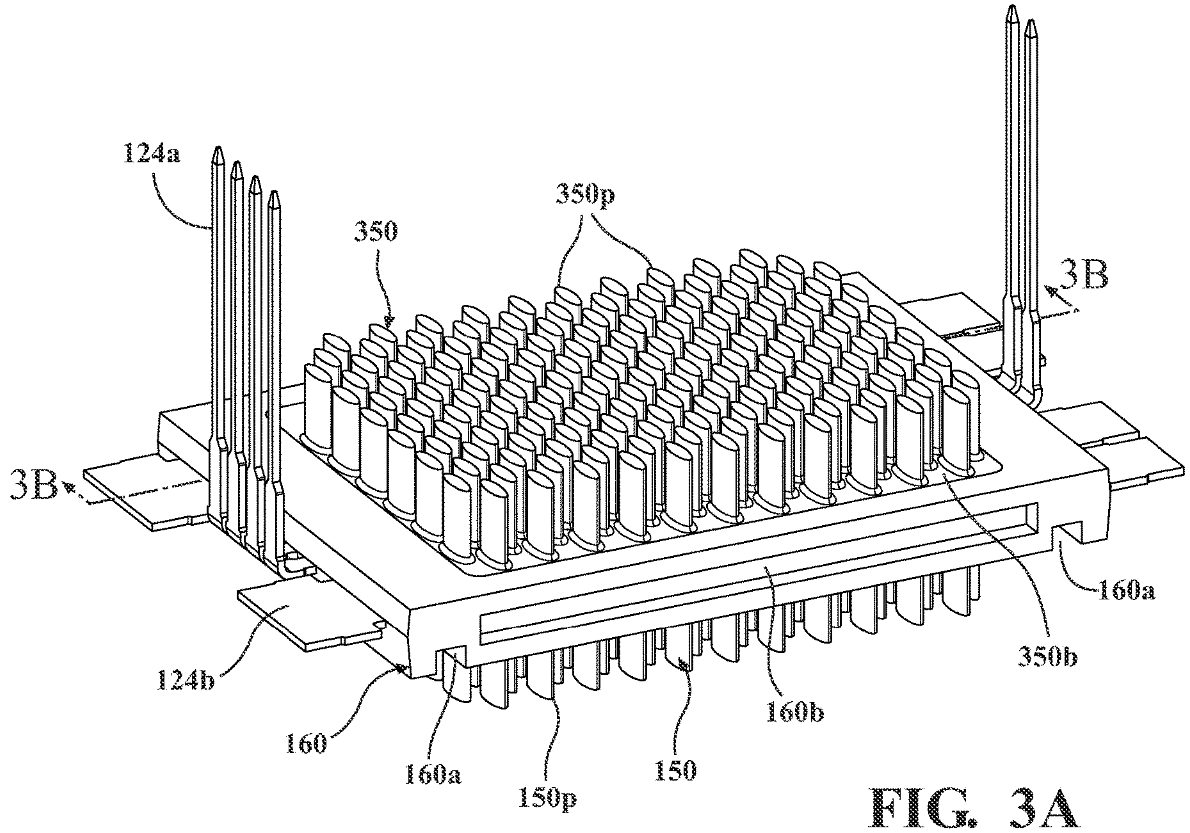
FIG. 3A is a schematic perspective view of a power card assembly in accordance with yet another embodiment described herein.
Figure 3B:
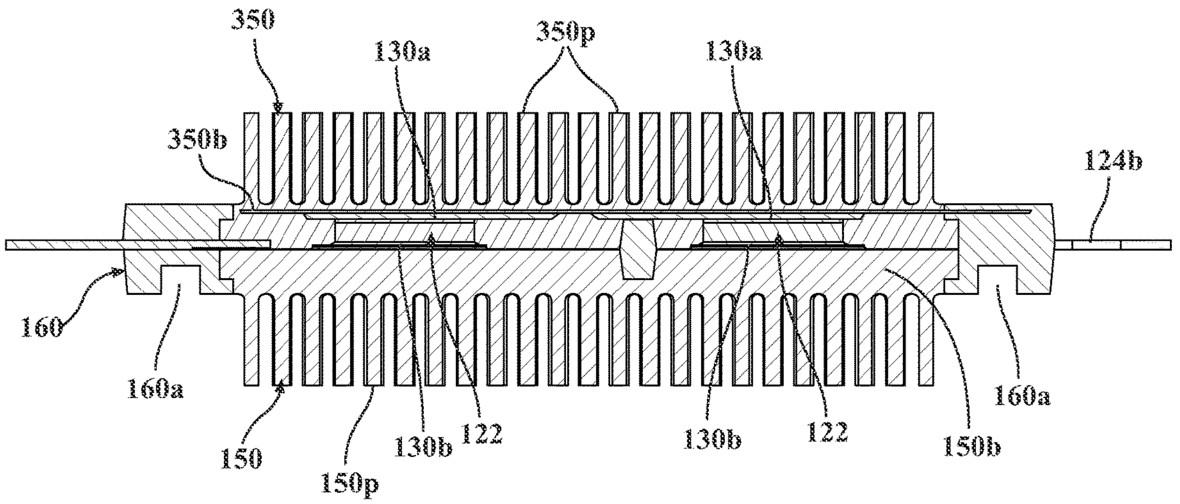
FIG. 3B is a schematic side cross-sectional view of the power card assembly of FIG. 3A.

FIG. 3A is a schematic perspective view of a power card assembly in accordance with yet another embodiment described herein. FIG. 3B is a schematic side cross-sectional view of the power card assembly of FIG. 3A. In the embodiment shown in FIGS. 3A and 3B, the emitter 140 shown in FIGS. 1A-1C has been replaced with an emitter 350 having the same basic structure as the emitter 150 previously described. Similar to the emitter 150, emitter 350 includes a base portion 350*b* and a plurality of adjacent spaced-apart projections 350*p* extending from the base portion 350*b*. This may enable a greater amount of heat to be more rapidly extracted from the IC's 122, from the sides of the IC's 122 that were in thermal communication with emitter 140.

Figure 1D:
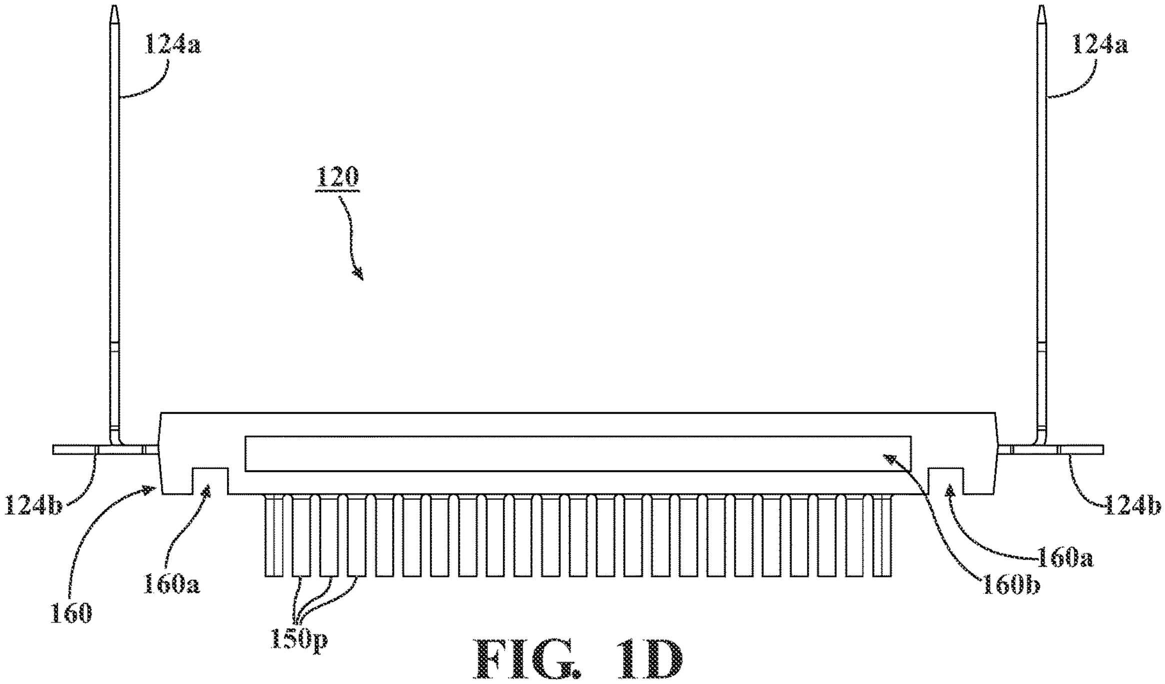
FIG. 1D is a schematic side view of the power card assembly of FIG. 1A.
Figure 4:
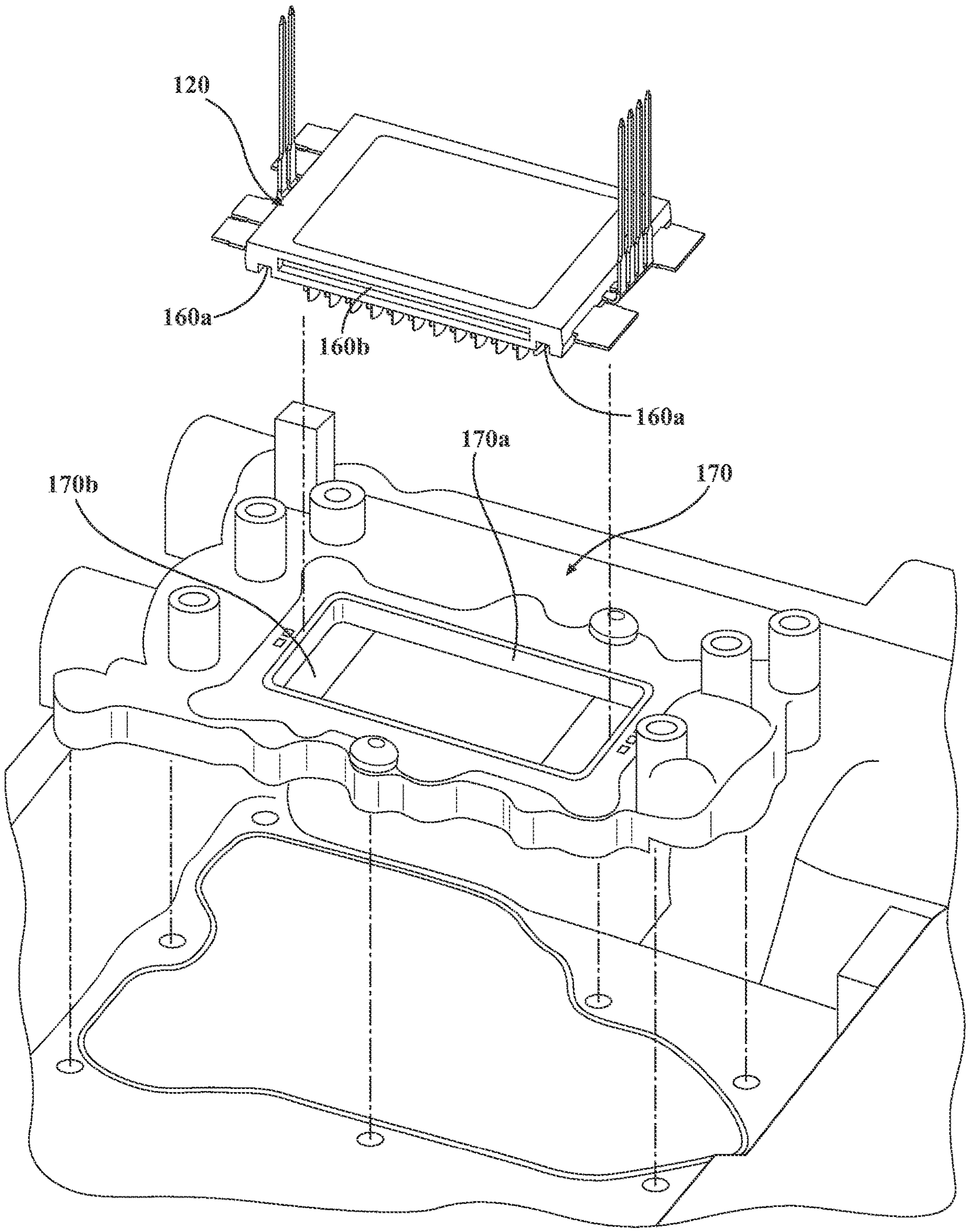
FIG. 4 is a schematic perspective view showing a possible application of the power card assembly shown in FIG. 1A.

Referring to the drawings, power card assembly embodiments described herein may also include an overmold 160 covering at least a portion of each of the integrated circuits 122 and any associated emitters. The overmold 160 may be structured to secure any emitters of the power card assembly in position with respect to associated integrated circuits 122. In one or more arrangements, the overmold 160 includes at least one cavity structured to receive therein at least a portion of a gasket (not shown). For example, referring to FIG. 1D, embodiments of the overmold 160 described herein may include a pair of first cavities 160*a* and a pair of second cavities 160*b*, with each of cavities 160*a* and 160*b* structured to receive a portion of an associated gasket therein. Each gasket may be structured to form a fluid-tight seal between the overmold 160 and the gasket when the gasket is pressurized against the overmold 160. Each gasket may also be structured to form a fluid-tight seal between the gasket and another element when the gasket is pressurized against the other element. Referring to FIG. 4, in one application example of a power card assembly as described herein, a power card assembly 120 as previously described may be mounted in a receptacle 170 formed in an electric traction motor in an electric vehicle (EV). When the power card assembly 120 is mounted in the receptacle 170, gaskets received in overmold cavities 160*a* may form fluid-tight seals with floor portions 170*b* of the receptacle 170 when the assembly 120 is pressed into the receptacle 170, while gaskets received in overmold cavities 160*b* may form fluid-tight seals with opposed side edges 170*a* of the receptacle 170.

The overmold 160 may be formed from a moldable polymer or other material or materials having suitable electrical properties (e.g., electrical insulation requirements) and which can be formed into shapes including the features shown in the drawings and described herein.

Figure 5A:
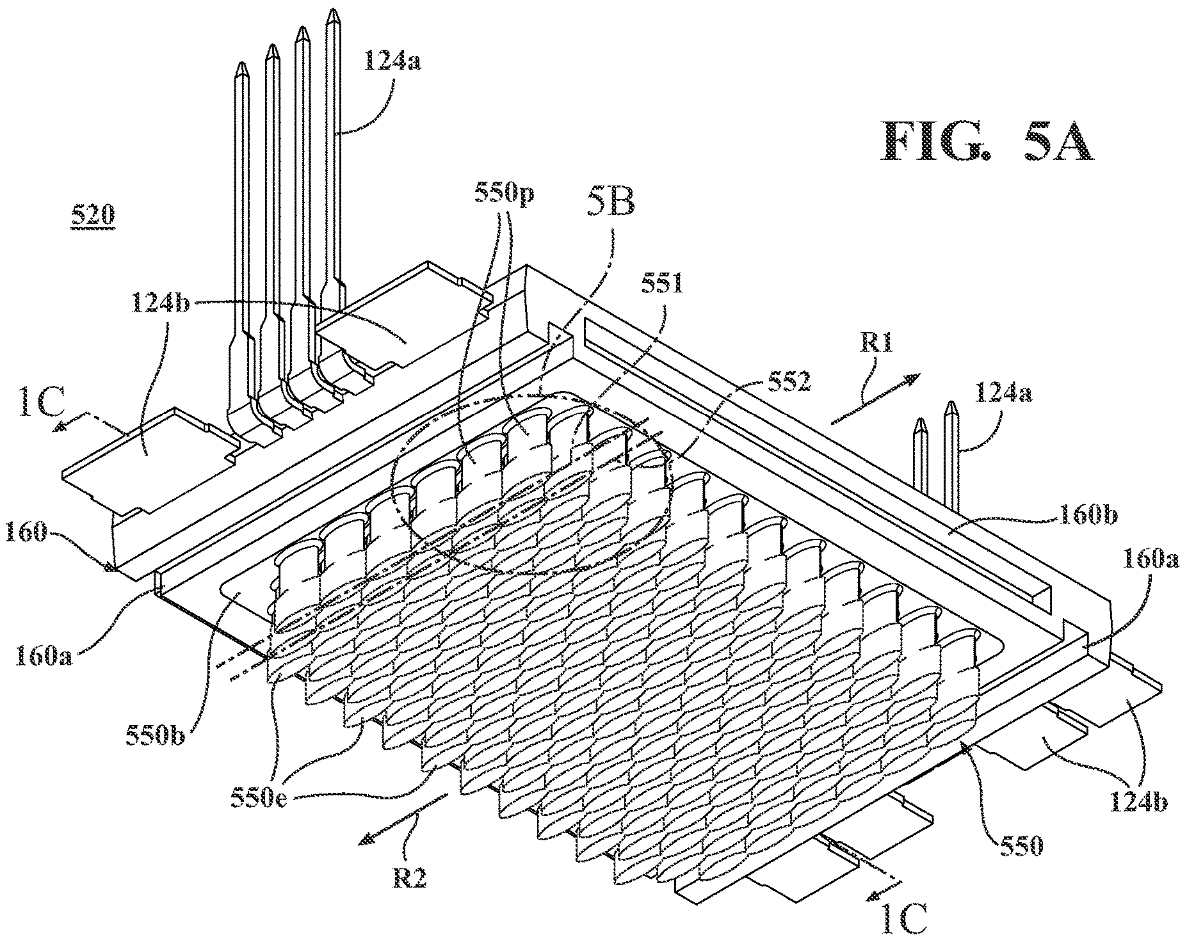
FIG. 5A is a schematic perspective view of a power card assembly in accordance with another embodiment described herein, incorporating a third embodiment of the second emitter.
Figure 5B:
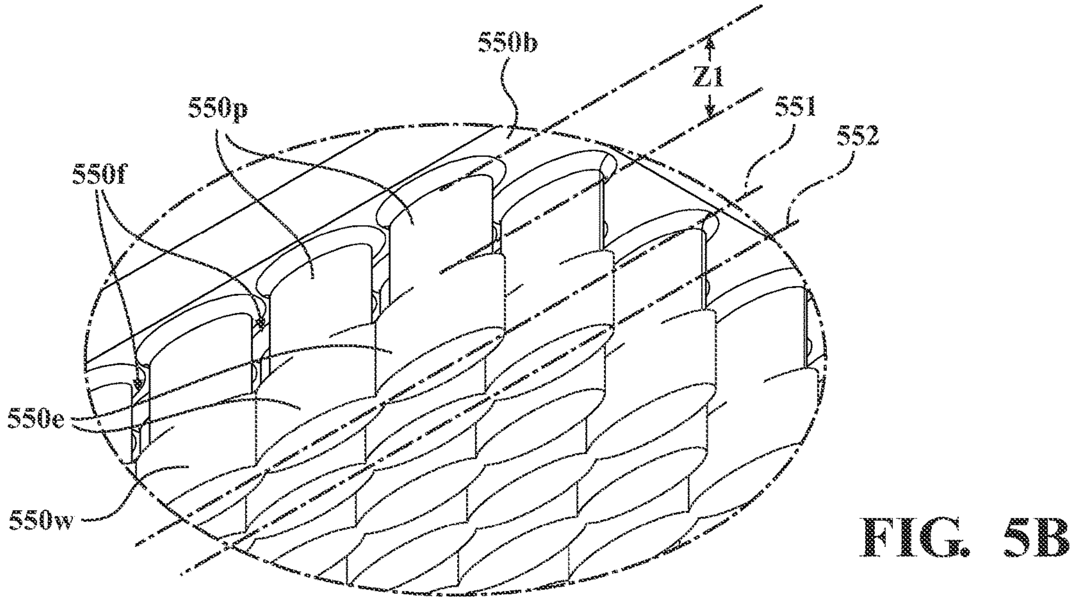
FIG. 5B is a magnified schematic perspective view of a portion of the second emitter embodiment shown in FIG. 5A.

FIGS. 5A-5B show an embodiment 520 of the power card assembly including a possible alternative embodiment 550 of the second emitter. Referring to FIGS. 5A-5B, in one possible arrangement, the second emitter 550 may include a base portion 550*b* and a cavity array defined by plurality of projections 550*p* extending from the base portion 550*b*. Exemplary adjacent parallel rows 551 and 552 of projections 550*p* are shown extending in opposite directions R1 and R2. In FIGS. 5A and 5B, the projections 550*p* have generally elliptical cross-sections as shown in FIG. 1B and as previously described. Parts of the projections extending from the base portion are spaced apart. However, the end portions 550*e* of the projections are enlarged at least along the directions R1, R2 that the rows of projections extend, so that adjacent ones of projection end portions 550*e* intersect to form a continuous wall 550*w* along each row of projections at the projection end portions. Fluid flow passages 550*f* between the projections 550*p* are thereby defined by the wall 550*w*, the non-enlarged parts of the projections 550*p* extending from the base portion 550*b* to the wall, and the base portion 550*b*. The flow passages 550*f* may have heights of Z1 extending between the base portion 550*b* and the wall 550*w* formed by the enlarged end portions 550*e* of the projections.

The second emitter 550 may be formed using any suitable process. In one example, a suitable additive manufacturing process (such as a 3D-printing process) may be used to deposit successive layers of material proceeding to progressively form the base portion 550*b* and the projections 550*p*.

Figure 6A:
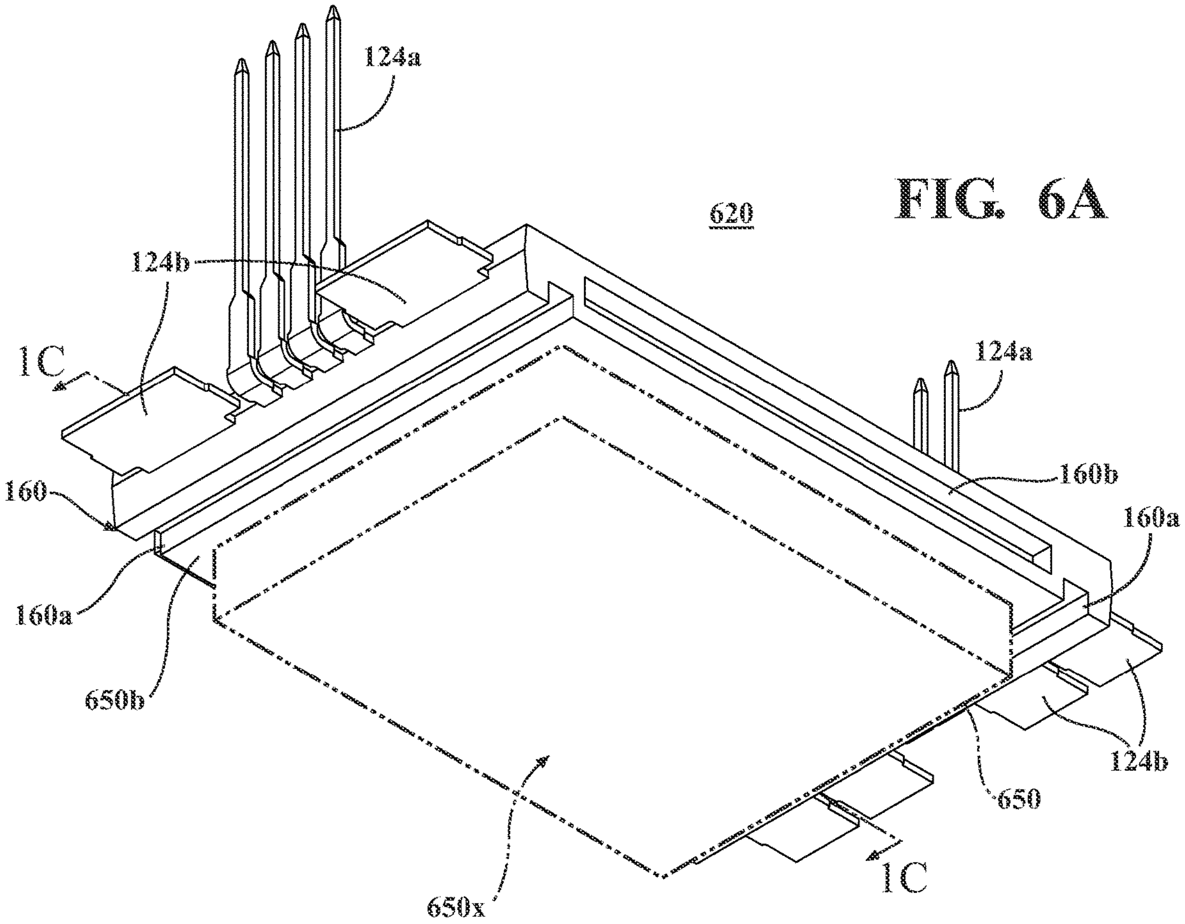
FIG. 6A is a schematic perspective view of a power card assembly in accordance with another embodiment described herein, incorporating a fourth embodiment of the second emitter.
Figure 6B:
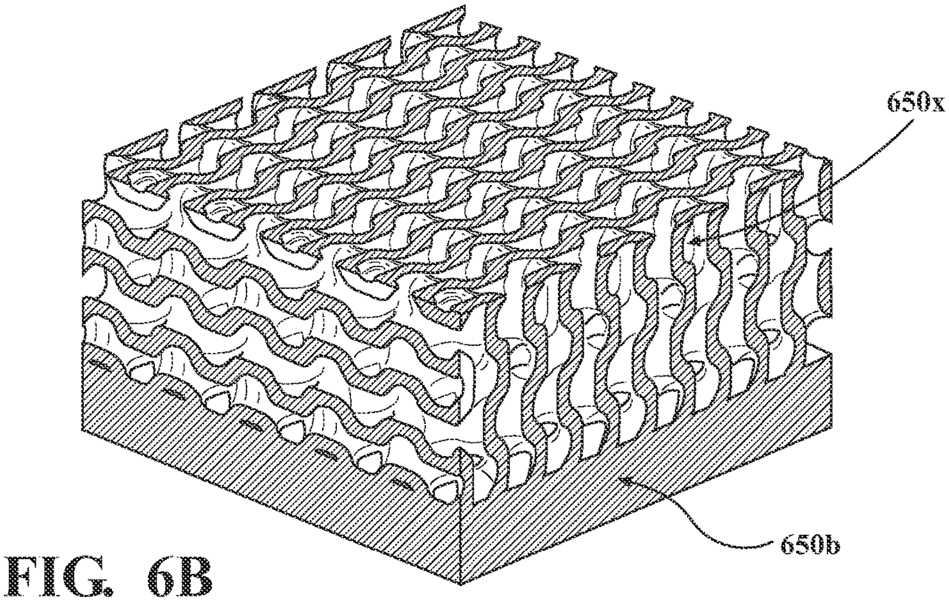
FIG. 6B is a schematic perspective view of an exemplary structure suitable for use as the second emitter in the power card assembly shown in FIG. 6A.

FIGS. 6A-6B show an embodiment 620 of the power card assembly including another possible alternative embodiment 650 of the second emitter. Referring to FIGS. 6A-6B, in another possible arrangement, a second emitter 650 may include a base portion 650*b* and a cavity array 650*x* formed by a porous Triply-Periodic-Minimal-Surface (TPMS) lattice structure, such as a gyroid structure. The use of such structures for heat transfer media is known. For instance, some non-exclusive examples of the design, characteristics, and uses of such structures for heat transfer applications are disclosed in a paper entitled "Flow Characterization in Triply-Periodic-Minimal-Surface (TPMS) based Porous Geometries: Part 1-Hydrodynamics" (by Rathore, S. S., Mehta, B., Kumar, P. et al. Flow Characterization in Triply Periodic Minimal Surface (TPMS)-Based Porous Geometries: Part 1-Hydrodynamics. *Transport in Porous Media,* 146, 669-701 (2023), https://doi.org/10.1007/s11242-022-01880-7), the contents of which are herein incorporated by reference in its entirety. This reference describes embodiments of a fluid-receiving cavity array (i.e., a porous TPMS lattice structure) comprising cavities (i.e., void regions) and the structures (i.e., solid regions) surrounding and defining the cavities. The void regions are configured for flow of an incompressible viscous fluid therethrough, to facilitate heat transfer from the lattice structure to the fluid for purposes of heat management.

Emitters incorporating porous TPMS lattice structures suitable for the applications described herein may be fabricated using additive manufacturing techniques, such as suitable 3D-printing techniques.

In one or more arrangements, any of the second emitter embodiments shown in FIGS. 5A-6B may include a cover attachable to the respective base portion, with the cover and the base portion combining to define an enclosure surrounding the respective fluid-receiving cavity array in thermal communication with the base portion, as previously described with respect to FIG. 2.

In other aspects, a method of cooling an integrated circuit may be provided. The method may include a step of securing an emitter in thermal communication with the integrated circuit, the emitter being structured to define an enclosure structured to receive heat communicated from the integrated circuit. The emitter may include a first passage structured to enable fluid communication into the enclosure, and a second passage structured to enable fluid communication out of the enclosure. The method may also include a step of generating a flow of coolant fluid into the enclosure through the first passage, through the enclosure to the second passage, and out of the enclosure through the second passage, to extract heat from the enclosure. In one or more arrangements, the enclosure includes a base portion and a plurality of projections extending into the enclosure from the base portion. The cover, the base portion, and the projections may be formed integrally as a single piece. In particular arrangements, the cover, the base portion, and the projections may be formed using an additive manufacturing process.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-4B, but the embodiments are not limited to the illustrated structure or application.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A power card assembly comprising:

an integrated circuit;

an emitter in thermal communication with the integrated circuit, the emitter including a base portion, a coolant fluid-receiving cavity array in thermal communication with the base portion and a cover attached to the base portion, the cover and the base portion combining to define an enclosure into which the coolant fluid-receiving cavity array extends; and an overmold covering at least a portion of each of the integrated circuit and the emitter and including at least one cavity structured to receive therein at least a portion of a gasket structured to form a fluid-tight seal between the overmold and the gasket when the gasket is pressurized against the overmold.

2. The power card assembly of claim 1, wherein the coolant fluid-receiving cavity array includes a plurality of spaced-apart projections extending from the base portion.

3. The power card assembly of claim 2, wherein the projections of the plurality of spaced-apart projections have elliptical cross-sectional shapes.

4. The power card assembly of claim 3, wherein end portions of adjacent projections of a row of projections are enlarged and structured to intersect so as to form a continuous wall extending along the row at the projection end portions, and wherein coolant fluid flow passages are formed between the wall, the non-enlarged parts of the projections, and the base portion.

5. The power card assembly of claim 2, wherein the coolant fluid-receiving cavity array comprises a porous Triply-Periodic-Minimal-Surface lattice structure.

6. The power card assembly of claim 1, wherein the cover includes:

at least one wall structured to define a cavity; and at least one passage extending through the at least one wall and structured to enable fluid communication between the cavity and an exterior of the cavity.

7. The power card assembly of claim 6, wherein the cover includes a pair of passages extending through the at least one wall, each passage being structured to enable fluid communication between the cavity and the exterior of the cavity.

8. The power card assembly of claim 1, wherein the cover, the base portion, and the coolant fluid-receiving cavity array are formed integrally as a single piece.

9. The power card assembly of claim 8, wherein the cover, the base portion, and the coolant fluid-receiving cavity array are formed using an additive manufacturing process.

10. The power card assembly of claim 1, wherein the overmold is structured to secure the emitter in position with respect to the integrated circuit.

11. A power card assembly comprising:

an integrated circuit;

an emitter positioned along a first side of the integrated circuit and in thermal communication with the integrated circuit, the emitter including a base portion and a coolant fluid-receiving cavity array in thermal communication with the base portion; and another emitter positioned along a second side of the integrated circuit opposite the first side.

12. The power card assembly of claim 11, wherein the other emitter includes a base portion and a coolant fluid-receiving cavity array in thermal communication with the base portion.

13. The power card assembly of claim 11, wherein the emitter further includes a cover attached to the base portion, the cover and the base portion combining to define an enclosure into which the coolant fluid-receiving cavity array extends.

14. The power card assembly of claim 13, wherein the cover, the base portion, and the coolant fluid-receiving cavity array are formed integrally as a single piece.

15. The power card assembly of claim 11, further comprising an overmold covering at least a portion of the emitter, the other emitter and the integrated circuit, the overmold being structured to secure the emitter and the other emitter in position with respect to the integrated circuit.

16. The power card assembly of claim 15, wherein the overmold includes at least one cavity structured to receive therein at least a portion of a gasket structured to form a fluid-tight seal between the overmold and the gasket when the gasket is pressurized against the overmold.

17. A method of cooling an integrated circuit, comprising steps of:

securing an emitter in thermal communication with the integrated circuit, the emitter including:

a base portion, a coolant fluid-receiving cavity array and a cover formed integrally with each other, the cover and the base portion combining to define an enclosure into which the coolant fluid-receiving cavity array extends, the coolant fluid-receiving cavity array being structured to receive heat communicated from the integrated circuit;

a first passage structured to enable fluid communication into the enclosure, and;

a second passage structured to enable fluid communication out of the enclosure; and generating a flow of coolant fluid into the enclosure through first passage, through at least a portion of the coolant fluid-receiving cavity array to the second passage, and out of the enclosure through the second passage, to extract heat from the emitter.

* * * * *